United States Patent
Stoica et al.

(10) Patent No.: US 7,184,943 B1
(45) Date of Patent: Feb. 27, 2007

(54) EVOLUTIONARY TECHNIQUE FOR AUTOMATED SYNTHESIS OF ELECTRONIC CIRCUITS

(75) Inventors: Adrian Stoica, Pasadena, CA (US); Carlos Harold Salazar-Lazaro, Pasadena, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 418 days.

(21) Appl. No.: 10/768,754

(22) Filed: Jan. 26, 2004

Related U.S. Application Data (63) Continuation of application No. 09/395,235, filed on Sep. 13, 1999, now Pat. No. 6,728,666.

(51) Int. Cl.
*G06F 7/62* (2006.01)

(52) U.S. Cl. .............................. 703/13; 702/2; 702/14; 702/15; 716/16; 706/13

(58) Field of Classification Search .................... 703/2, 703/13, 14; 716/16; 709/203; 706/13
See application file for complete search history.

(56) References Cited

U.S. PATENT DOCUMENTS

| | | | | |
|---|---|---|---|---|
| 5,021,856 A | * | 6/1991 | Wheaton | 257/565 |
| 5,258,947 A | | 11/1993 | Sourgen | 365/96 |
| 5,677,691 A | * | 10/1997 | Hosticka et al. | 341/155 |
| 5,705,938 A | | 1/1998 | Kean | 326/39 |
| 5,867,397 A | * | 2/1999 | Koza et al. | 703/14 |
| 5,897,628 A | | 4/1999 | Kitano | 706/13 |
| 5,959,871 A | | 9/1999 | Pierzchala et al. | 364/489 |
| 5,970,487 A | * | 10/1999 | Shackleford et al. | 707/6 |
| 6,094,065 A | * | 7/2000 | Tavana et al. | 326/39 |
| 6,185,547 B1 | * | 2/2001 | Shackleford et al. | 706/13 |
| 6,195,593 B1 | * | 2/2001 | Nguyen | 700/97 |
| 6,360,191 B1 | * | 3/2002 | Koza et al. | 703/6 |
| 6,363,517 B1 | * | 3/2002 | Levi et al. | 716/6 |
| 6,363,519 B1 | * | 3/2002 | Levi et al. | 716/16 |
| 6,378,122 B1 | * | 4/2002 | Levi et al. | 716/16 |
| 6,510,547 B1 | * | 1/2003 | Levi | 716/16 |
| 6,526,556 B1 | * | 2/2003 | Stoica et al. | 716/16 |
| 6,539,532 B1 | * | 3/2003 | Levi et al. | 716/16 |
| 6,728,666 B1 | * | 4/2004 | Stoica et al. | 703/13 |
| 7,072,814 B1 | * | 7/2006 | Stoica | 703/13 |

OTHER PUBLICATIONS

"Genetic FPGA: Evolving Stable Circuits on Mainstream FPGA Devices", Levi et al, Proceedings NASA/DoD Evolvable hardware workshop, pp. 12-17, IEEE 1999.*

(Continued)

*Primary Examiner*—Fred Ferris
(74) *Attorney, Agent, or Firm*—Mark Homer (57) ABSTRACT

An evolvable circuit includes a plurality of reconfigurable switches, a plurality of transistors within a region of the circuit, the plurality of transistors having terminals, the plurality of transistors being coupled between a power source terminal and a power sink terminal so as to be capable of admitting power between the power source terminal and the power sink terminal, the plurality of transistors being coupled so that every transistor to transistor terminal coupling within the region of the circuit comprises a reconfigurable switch.

20 Claims, 4 Drawing Sheets

OTHER PUBLICATIONS

"Promises and Challenges of Evolvable Hardware", Yao et al, IEEE Transactions on Sys, Man, Cyber Part C, vol. 29, No. 1 Feb. 1999.*

Bennett, F. III, et al. "Evolution of a 60 decibel Op Amp Using Genetic Programming", *First Int'l. Conf. On Evolvable Systems*, Springer-Verlag, Japan, 1996, pp. 455-469.

Flockton, Stuart J., et al., "Intrinsic Circuit Evolution Using Programmable Analogue Arrays," *Proc. Of the Second Int'l. Conf. On Evolvable Systems: From Biology to Hardware*, Springer-Verlag, Switzerland, 1998, pp. 144-153.

Iba, Hitishi, et al., "Machine Learning Approach to Gate-Level Evolvable Hardware," *Proc. Of the First Int'l. Conf. On Evolvable Systems*, Springer-Verlag, Japan, 1996, pp. 327-343.

Kajitani, Isamu, et al., "A gate-level Ettw Chip: Implementing GA operations and reconfigurable hardware on a single LSI," *Proc. Of the Second Intl'l Conf. On Evolvable Sytems: From Biology to Hardware*, Springer-Verlag, Berlin, 1998, pp. 1-12.

Koza, John R., et al., "Reuse, Parameterized Reuse, and Hierarchical Reuse of Substructures in Evolving Electrical Circuits Using Genetic Programming," *Proc. Of the First Int'l. Conf. On Evolvable Systems*, Springer-Verlag, Japan, 1996, pp. 312-326.

Koza, John R., et al., "Automated WYWIWYG Design of Both the Topology and Component Values of Electrical Circutis Using Genetic Programming," *Proc. Of the First Annual Genetic Programming Conference*, MIT Press, Cambridge MA, 1996, pp. 123-131.

Koza, John R. et al., "Automated Synthesis of Analog Electrical Circuits by Means of Genetic Programming," *IEEE Transaction on Evolutionary Computation*, vol. 1, No. 2, 1997, pp. 109-128.

Lohn, Jason D., et al., "Automated Analog Circuit Synthesis Using a Linear Representation," *Proc. Of the Second Int'l. Conf. On Evolvable Systems: From Biology to Hardware*, Springer-Verlag, Berlin, 1998, pp. 125-133.

Murakawa, Masahiro, et al., "Analogue EHW Chip for Intermediate Frequency Filters," *Proc. Of the Second Int'l Conf. On Evolvable Systems: From Biology to Hardware*, Springer-Verlag, Berlin, 1998, pp. 143-143.

Stoica, Adrian, "On Hardware Evolvability and Levels of Granularity," *International Conference On Intelligent Systems and Semiotics*, NIST, Gaithersburg VA, Sep. 1997, pp. 244-247.

Thompson, Adrian, "Silicon Evolution," *Proc. Of the First Annual Genetic Programming Conference*, MIT Press, Cambridge MA, 1996, pp. 444-452.

Thompson, Adrian, "On the Automatic Design of Robust Electronics Through Artificial Evolution," *Proc. Of the Second Int'l. Conf. On Evolvable Systems: From Biology to Hardware*, Springer-Verlag, Switzerland, 1998, pp. 13-24.

Thompson, Adrian, "An evolved circuit, intrinsic in silicon, entwined with physics," *Proc. Of the First Int'l. Conf. On Evolvable Systems*, Springer-Verlag, Japan, 1996, pp. 390-405.

Zebulum, Richard S., et al., "Evolvable Systems in Hardware Design: Taxonomy, Survey and Applications," *Proc. Of the First Int'l. Conf. On Evolvable Systems*, Springer-Verlag, Japan, 1996, pp. 344-358.

Zebulum, Richard S., et al., "Analog Circuits Evolution in Extrinsic and Intrinsic Modes," *Proc. Of the Second Int'l. Conf. On Evolvable Systems: From Biology to Hardware*, Springer-Verlag, Berlin, 1998, pp. 154-165.

Augusto, Soares J.A., and Almeida, Beltran C.F., "Analog Fault Diagnosis in Nonlinear DC Circuits with an Evolutionary Algorithm," *IEEE*, Jul. 2000, pp. 609-616.

Layzell, Paul, "A New Research Tool for Intrinsic Hardware Evolution," Second International Conference, *ICES98*, Lausanne, Switzerland, Springer, Sep. 23-25, 1998, pp. 47-56.

Perkowski, M. Chebotarev, A., and Mishchenko, A., "Evolvable Hardware or Learning Hardware? Induction of State Machines from Temporal Logic Constraints," *Proceedings of the First NASA/DoD Workshop*, Jul. 19-21, 1999, pp. 129-138.

Stoica, Adrian, "Reconfigurable Transistor Arrays for Evolvable Hardware," NASA Tech Brief, vol. 25, No. 2, Item # from JPL New Technology Report NPO-20078, Jul. 26, 1996, pp. 5a.

Stoica, Adrian, "Evolvable Hardware: From On-Chip Circuit Synthesis to Evolvable Space," *IEEE*, May 2000, pp. 1-9.

Stoica, Adrian, "Toward Evolvable Hardware Chips: Experiments with a Programmable Transistor Array," *IEEE*, Apr. 1999, pp. 1-7.

Stoica, A., Keymeulen, D., Duong, V., and Salazar-Lazaro, C., "Automatic Synthesis and Fault-Tolerant Experiments on an Evolvable Hardware Platform," *IEEE*, Oct. 2000, pp. 465-471.

Stoica, A., Keymeulen, D., Salazar-Lazaro, C., Li, W., Hayworth, K., and Tawerl, R., "Toward On-board Synthesis and Adaption of Electric Functions: An Evolvable Hardware Approach," *IEEE*, vol. 2, Mar. 1999, pp. 351-357.

Stoica, A., Keymeulen, D., Tawel, R., Salazar-Lazaro, C., and Li, W., "Evolutionary experiments with a fine-grained reconfigurable architecture for analog and digital CMOS circuits," *Evolvable Hardware '99: Proceedings of the First NASA/DoD Workshop on Evolvable Hardware*, Pasadena, CA, Jul. 19-21, 1999.

Stoica, A., Salazar-Lazaro, C., and Tawel, R., "Evolvable Electronic Systems," *1998 Military and Aerospace Applications of Programmable Devices and Technologies (MAPLD) Conference*, Pasadena, CA, Sep. 15-16, 1998.

Stoica, A., Keymeulen, D., Zebulum, R., Thakoor, A., Daud, T., Klimeck, G., Jin, Y., Tawel, R., and Duong, V., "Evolution of analog circuits on Field Programmable Transistor Arrays," *IEEE*, Jul. 2000, pp. 1-10.

Stoica, A., Klimeck, G., Salazar-Lazaro, C., Keymeulen, D., and Thakoor, A., "Evolutionary Design of Electronic Devices and Circuits," *Evolutionary Computation, Proceedings of the 1999 Congress*, Washington, D.C., Jul. 6-9, 1999, pp. 1271-1278.

Zebulum, R., Pacheco, M., "Evolvable Hardware: On the Automatic Synthesis of Analog Control Systems," *IEEE*, Mar. 2000, pp. 451-463.

Zebulum, R., Stoica, A., and Keymeulen, D., "A Flexible Model of a CMOS Field Programmable Transistor Array Targeted for Hardware Evolution," 3rd *International Conference on Evolvable Systems, ICES2000*, Edinburgh, Scotland, Apr. 2000.

* cited by examiner

EVOLUTIONARY TECHNIQUE FOR AUTOMATED SYNTHESIS OF ELECTRONIC CIRCUITS

CROSS-REFERENCE TO RELATED APPLICATION

This application is a continuation of application Ser. No. 09/395,235, now U.S. Pat. No. 6,728,666, filed Sep. 13, 1999 by Adrian Stoica, et al. entitled, "EVOLUTIONARY TECHNIQUE FOR AUTOMATED SYNTHESIS OF ELECTRONIC CIRCUITS", and assigned to the assignee of the present application.

ORIGIN OF THE INVENTION

The invention described herein was made in the performance of work under a NASA contract, and is subject to the Provisions of Public Law 96-517 (35 U.S.C. § 202) in which the Contractor has elected not to retain title.

BACKGROUND

Evolvable Hardware or EHW is reconfigurable hardware that self-configures under the control of an evolutionary algorithm. In evolutionary electronics, the search for an electronic circuit reconfiguration can be made in software and the final solution downloaded or become a blueprint for hardware, which is referred to as extrinsic evolution. Alternatively, evolution can be performed directly in hardware, referred to as intrinsic evolution. With intrinsic evolution, solutions may be evolved directly on a chip.

Figure 1:
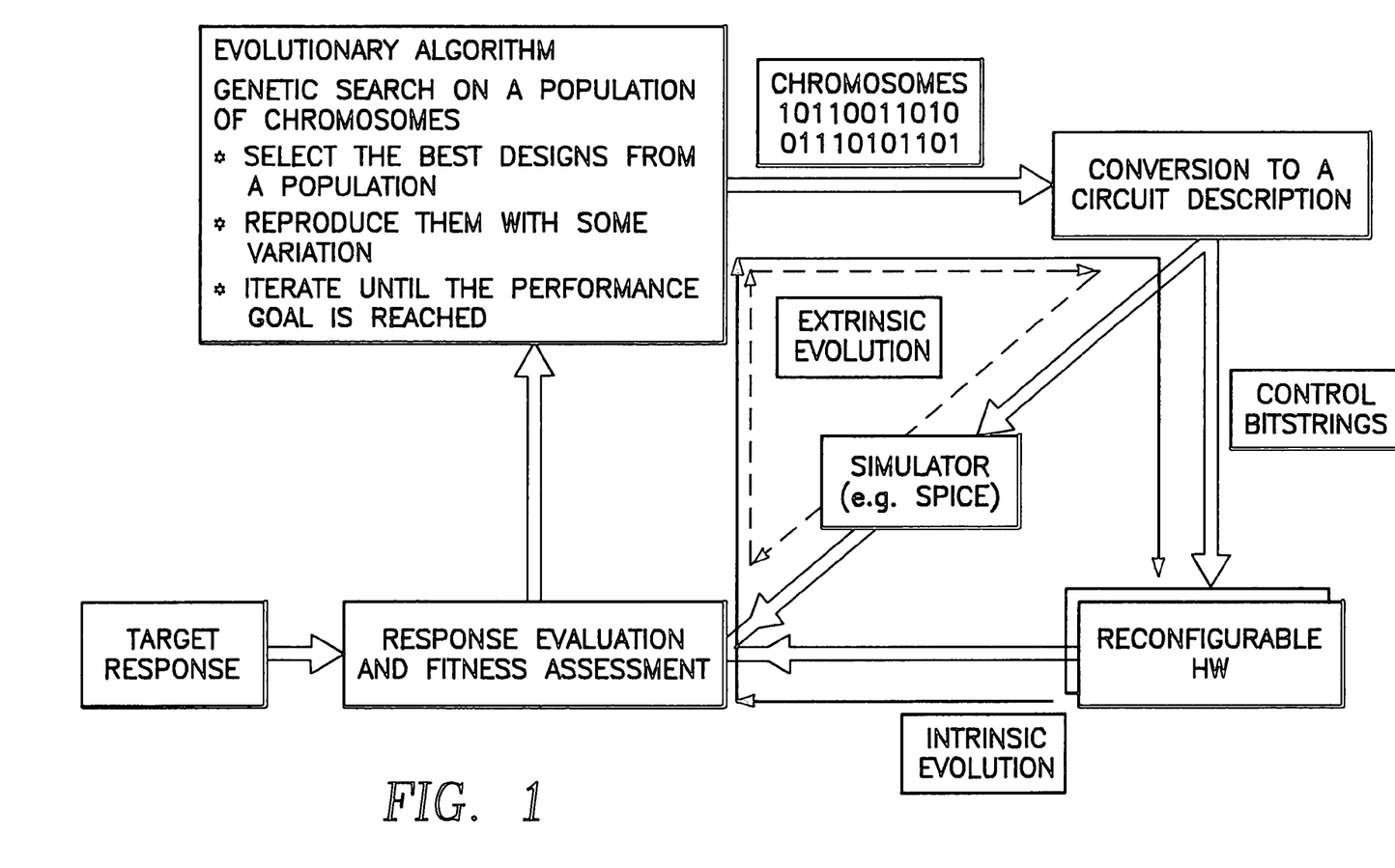
FIG. 1 shows a simplified functional block diagram of evolutionary processes.

The main steps of evolutionary synthesis are illustrated in FIG. 1. First, a population of chromosomes is randomly generated. The chromosomes are converted into circuit models for extrinsic EHW, or control bit strings downloaded to programmable hardware for intrinsic EHW. Circuit responses are compared against specifications of a target response, and individuals are ranked based on how close they come to satisfying it. In preparation for a new iteration loop, a new population of individuals is generated from the pool of best individuals in the previous generation, some of these individuals are taken as they were and some are modified by genetic operators such as chromosome crossover and mutation. This process is repeated for many generations, and results in increasingly better individuals. Such a process is usually stopped after a number of generations, or when the closeness to the target response has reached a sufficient degree. One of several solutions may be found among the individuals of the last generation.

A variety of circuits have been synthesized through extrinsic evolutionary means. For example, Koza et al., in U.S. Pat. No. 5,867,397, issued on Feb. 2, 1999, entitled, "METHOD AND APPARATUS FOR AUTOMATED DESIGN OF COMPLEX STRUCTURES USING GENETIC PROGRAMMING", herein incorporated by reference in its entirety, used Genetic Programming (GP) to grow an "embryonic" circuit to a circuit that satisfies desired requirements. This approach was used for evolving a variety of circuits, including filters and computational circuits. An alternative encoding technique using a linear representation, which has the advantage of reduced computational load, has been used in for automated filter design.

With these extrinsic approaches, though, evolutions of analog circuits were performed in simulations, without concern of a physical implementation, but rather, as a proof-of-concept that evolution can lead to designs that compete or even exceed the performance of human designs. Although in principle, one can test their validity in circuits built from discrete components, or in an ASIC, no analog programmable devices exist that would support the implementation of the resulting design. Thus, these approaches do not provide a practical solution to intrinsic evolution.

Intrinsic evolution can speed-up the search for a solution circuit by a few orders of magnitude compared to evolution in software simulations, specifically if one simulates large, complex analog circuits, and if the circuit response is rapid. Moreover, since the software simulation relies on models of physical hardware with limited accuracy, a solution evolved in software may behave differently when downloaded in programmable hardware; such mismatches are avoided when evolution takes place directly in hardware. Further, unlike software evaluation where more complex circuitry and more accurate modeling takes longer to evaluate, hardware evolution scales well with both size of the circuits and model accuracy, thus providing less significant increases in evaluation time.

Although reconfigurable devices exist, they have a limited range of possible applications. On-chip evolution was demonstrated by A. Thompson, in *Silicon Evolution*, in Proceedings of Genetic Programming 1996 (GP96), MIT Press, herein incorporated by reference in its entirety, using a Field Programmable Gate Array or FPGA as a programmable digital device, and a Genetic Algorithm or GA as the evolutionary mechanism.

Such a technique using gate arrays, however, is not practical for analog circuit evolution. Logical gates are not good elementary building blocks for analog circuits as they are designed optimized for logical/binary behaviors. For example, transistor interconnections that are designed to facilitate digital logic signals and flows do not necessarily provide good analog response and signal flow. The usage of the gate array for evolution can result in exploitation by evolution, of parasitic and unintended signal paths and functioning modes for the components. As a result, circuits may evolve in one region of a chip that can not be replicated in other parts, or on other chips, although the same genetic code is used.

Moreover, conventional on chip evolution has not provided sufficient granularity for practical applications. While several levels of granularity are in use, the most common digital devices are configurable at the gate-level. In the analog programmable devices, such as in Field Programmable Analog Arrays or FPAAs, the reconfigurable active elements are Operational Amplifiers, which have only very coarse granularity and little functionality with good precision, thus having only a limited range of possible applications.

Computation by analog circuitry has been lost as a technique for information processing because analog circuits were not easily programmable, and required precise components with no drifts. If the evolutionary mechanism and process proves sufficiently powerful for evolving complex analog circuits, then its combination with reconfigurable analog devices potentially will be able to capture the benefits of analog in new applications. As such, the potential of analog processing is much greater than what is able to be exploited today.

Analog circuitry has advantages in cost, size and power consumption (as compared to digital circuitry) and can directly process signals that are continual in time and amplitude. Even a single transistor has many functions such as generation of square, square-root, exponential and logarithmic functions, voltage-controlled current sources; analog multiplication of voltages, and short term and long term analog storage. As such, the basic combinations of transistors offer a rich repertoire of linear and nonlinear operators available for local and collective analog processing. Using evolution, the benefits of analog processing can be exploited, while its disadvantages reduced or even eliminated.

Also, it has been recognized by the inventors herein that evolutionary searches may perform significantly better with analog than with digital circuitry. A possible explanation lies in the fact that analog behaviors have relatively smoother spaces, which is better for the evolutionary search. Thus, new perspectives are possible: evolutionary searches offering automatic programming; sufficiently precise equivalent components could be obtained if the programmable analog components offer controllability of their operating points; and drifts that can be compensated for by adjusting operating points or, if the drifts are too strong, by a new search for a different optimal circuit configuration and operating point. Moreover, analog computation on simple low-power circuits can boost emerging applications areas of "smart matter" and distributed high bandwidth adaptive sensing.

Furthermore, a hardware implementation also offers a big advantage in evaluation time for a circuit; the time for evaluation is determined by the goal function. For example, considering an A/D converter operating at a 100 kHz sampling rate, the electronic response of the A/D converter is available within 10 microseconds, compared to 1 second on a computer running SPICE; this advantage increases with the complexity of the circuits. In this case, the 1 speedup would allow evaluations of populations of millions of individuals in seconds instead of days. Moreover, the higher the frequency at which a circuit needs to function, the shorter is its evaluation time, making the design of very high frequency circuits an excellent candidate for intrinsic evolutionary design.

Thus, a practical solution to intrinsic evolution for programming analog devices is desirable. Furthermore, a shift in the design approach, from reconfigurable devices, to evolution-oriented devices or evolvable devices would facilitate hardware evolvability.

SUMMARY OF THE INVENTION

The preferred embodiment provides a programmable transistor array or PTA, which is programmable at the transistor level. It is possible to conveniently form such an array of N-type and P-type complementary field effect transistors, although it may be formed of other type devices. The preferred embodiment of the present invention provides an evolvable circuit having a plurality of transistors having terminals, the transistors being coupled between a power source terminal and a power sink terminal so as to be capable of admitting power between the power source terminal and the power sink terminal. Transistor terminal to transistor terminal couplings are provided via reconfigurable switches.

In a preferred embodiment, the plurality of transistors are coupled together in a topology so that a permutation of switch states of the plurality of switches provides a majority of meaningful circuit connections for a selected transistor topology, the plurality of transistors being coupled so that there are less than a total number of possible transistor terminal to transistor terminal couplings. With this embodiment, the plurality of transistor terminals may be coupled so as to be capable of providing both analog and digital responses to input signals.

The evolvable circuit of the present invention may have at least one of the plurality of transistors having its control terminal coupled one of its first and second power terminals, at least one of the plurality of transistors having its control terminal coupled to the control terminal of another of the plurality transistors, or at least one of the plurality of transistors may have a bypass switch coupled across its power terminals. In one preferred embodiment, all these terminal couplings are present.

In further preferred embodiments, the plurality of transistors are arranged in a plurality of layers, each transistor of a layer being coupled to at least one transistor of an adjacent layer. Such an embodiment may have a first layer having the first power terminals of each of the first and second transistors coupled to the power source terminal; and have at least one intermediate layer having the first power terminals of the first and the second transistors coupled to the second power terminals of the first and second transistors of a preceding layer, respectively; and having the second power terminals of the first and second transistors coupled to the first terminal of a succeeding layer, respectively; and have a last layer having the second power terminals of the first and second transistors coupled to the power sink terminal.

The plurality of transistors may be arranged to form a module which may be connected via reconfigurable switches to other modules to provide solutions to more complex problems. In one embodiment, several modules may be arranged on a single chip so that modules disposed near a center of a module arrangement have a greater number of inter-module couplings than do modules near a periphery of the plurality of the arrangement. In some embodiments, inter-module coupling may be uniform across the array.

In some embodiments the reconfigurable switches may be transistors operated as ON/OFF switches. In other embodiments, the reconfigurable switches may be operated in gradual high/low states that provide variable conductance states. With this embodiment, the gradual switches may be controlled so that evolution provides a morphing process which can ultimately reach solutions with ON/OFF switch states.

DETAILED DESCRIPTION OF THE INVENTION

The preferred embodiment of the present invention provides a circuit adapted for use in intrinsic evolution. The preferred embodiment provides a programmable transistor array or PTA, which is programmable at the transistor level. In a preferred embodiment of the present invention, transistors form a plurality of modules, which may be interconnected to other modules, or to other transistors of the PTA, to provide further functionality.

Figure 2:
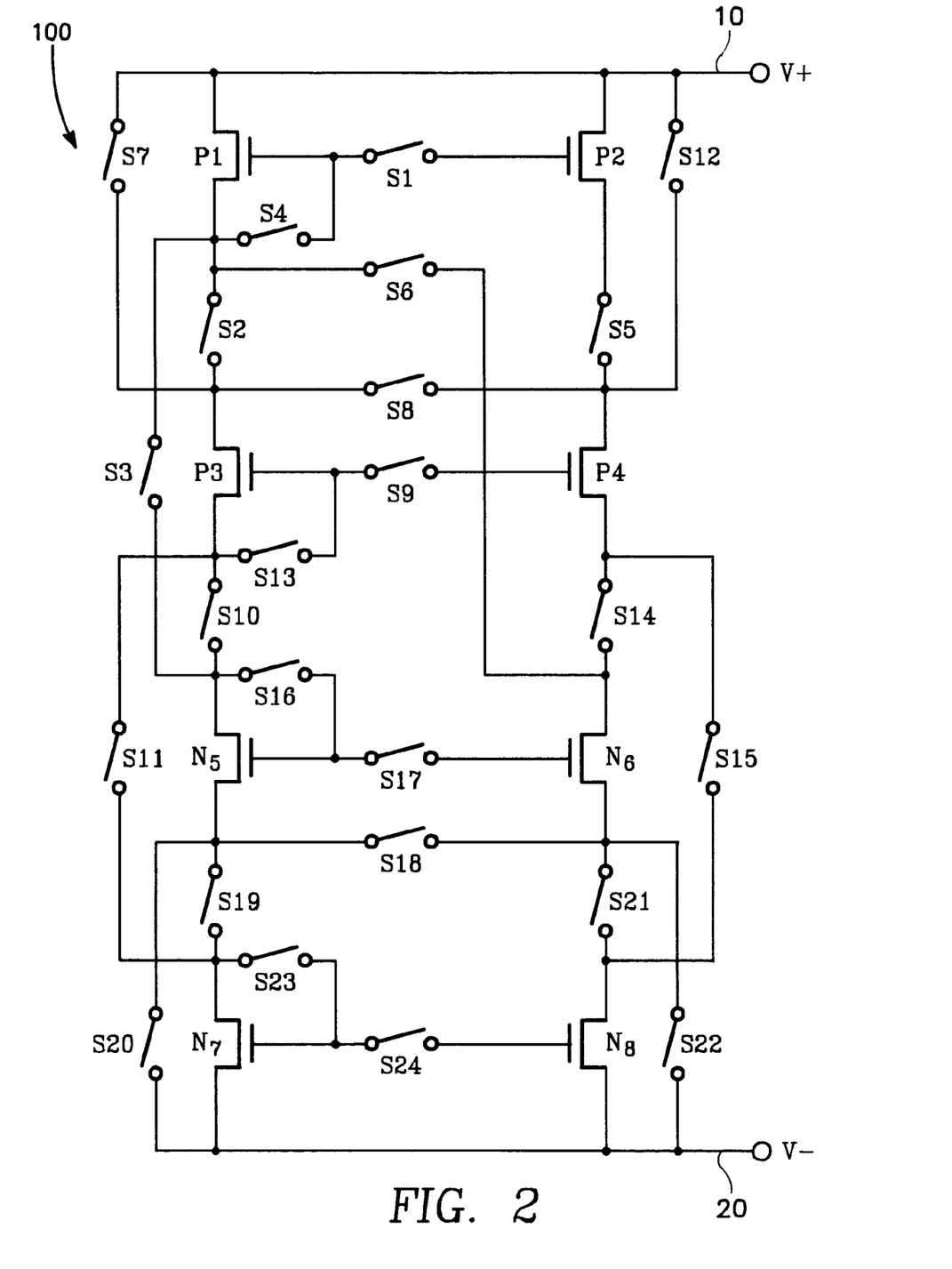
FIG. 2 is a preferred embodiment of a circuit in accordance with the present invention.

Turning to FIG. 2, the PTA module 100 is an array of transistors interconnected by programmable switches. These switches provided transistor terminal to transistor terminal, or transistor terminal to power terminal connections. The status of the switches (On or Off) determines a circuit topology and consequently a specific response. Thus, the topology can be considered as a function of switch states, and can be represented by a binary sequence, such as a chromosome pattern of "1011 . . . ", where by convention, one can assign 1 to a switch turned On and 0 to a switch turned Off. Programming the switches On and Off determines a circuit and provides a means responsive to a chromosome pattern for selectively controlling the coupling of the interconnections of the transistor array.

In the preferred embodiment, the PTA allows programming of both analog and digital circuits by intrinsic evolution. In a preferred embodiment, CMOS field effect transistors are used as the elemental building blocks, although other embodiments may employ other type devices, such as bipolar devices, single electron devices, quantum dot devices, resonant tunneling devices, optically coupled devices, or other similar devices, as elemental building blocks. CMOS transistors allow evolution to take advantage of inherent resistance and capacitance functions, as well as analog and digital transistor operation.

As all integrated circuits ultimately rely on functions implemented with transistors, the PTA of the preferred embodiment provides a versatile platform for synthesis of analog, digital, or even mixed-signal circuits using the same transistors. It also provides a more suitable platform for synthesis of analog circuitry than other reconfigurable devices and allows transferrable analog circuits to be evolved directly on the chip.

The optimal choice of elementary block type and granularity is task dependent. The preferred embodiment of the present invention provides reconfigurable modules 100 based on elements of the lowest level of granularity. With such a configuration, virtual higher-level building blocks can be implemented by imposing programming constraints. An example would be forcing groups of elementary cells to act as a whole, such as by freezing certain parts of the switch configuration bit string to provide digital gates or basic analog circuits.

Thus, the PTA of the preferred embodiment of the present invention may provide versatile functional cells to provide a higher level of functionality. More specifically, for example, certain parts of the switch configuration bit string could be frozen to provide interconnections between the N-type transistors to form a virtual NAND gate. Ideally, the virtual blocks for evolution should be automatically defined/clustered during evolution. This concept is analogous to the Automatically Defined Functions predicted and observed in software evolution.

As such, granularity selection allows for mixed granularity solutions. Higher level functionality may be combined with elemental functionality within modules on the same chip to allow evolved circuit designs not obtainable with only higher level cells. Also, such granularity selection allows for hybrid digital/analog solutions not readily obtainable in current arrays.

FIG. 2 illustrates an embodiment of a PTA module 100 having 8 transistors and 24 programmable switches. In this embodiment, the transistors P1–P4 are PMOS and N5–N8 are NMOS. The plurality of transistors P1–N8 are coupled between a power source terminal 10 and a power sink terminal 20 in a topology capable of admitting power between the power source terminal 10 and the power sink terminal 20. In the embodiment of FIG. 2, the plurality of transistors P1–N8 are coupled via reconfigurable switches S1–S24 so that every transistor terminal to transistor terminal interconnection is via a reconfigurable switch.

Although it is preferred to provide a reconfigurable switch between every terminal to terminal interconnection, it is possible, in some embodiments, to provide a hard connection between certain transistor terminals, such as a hard bias connection, or a gate to gate connection. Although such hard connections will limit evolutionary circuit possibilities, such a connection may be desirable, for example, when evolution will be employed to evolve a specific family of circuits employing recurrent, frequent, or common connection types, or in other circumstances.

Thus, with the preferred embodiment, the PTA has at least one contiguous region within the array where every transistor terminal to transistor terminal connection is via a reconfigurable switch. Further, in such an embodiment, at least one of the transistors within the region has every terminal connected via a reconfigurable switch to other terminals of other transistor(s) within the region.

In the preferred embodiment, the arrangement of reconfigurable switches S1–S24 is such that a permutation of switch states provides a majority of meaningful circuit connections of transistors P1–N8 for a selected transistor arrangement, but so that there are less than the total number of possible transistor terminal connections. Thus, the transistors P1–N8 and the switches S1–S24 are arranged so that module 100 provides an extensive number of functional circuits for the permutation of switch S1–S24 states.

In one embodiment, a means to accomplish this is to arrange the transistors P1–N8 in layers between the power source terminal 10 and the power sink terminal 20. The interconnections of terminals of the transistors P1–N8, including transistor to power terminal coupling, transistor to transistor coupling, and transistor self coupling generally allow non-conflicting current flow paths. In general, terminals should be coupled to facilitate current flow. In other words, a terminal that typically provides current should be coupled to at least one that typically receives current. For example, a drain terminal of a P-type transistor typically is coupled via a reconfigurable switch to the source terminal of another P-type transistor, such as S2 or S5, or to a drain terminal of an N-type, such as S3, S11, or S15. Likewise, the drain of a P-type transistor typically is coupled via switch to the drain of an N-type, such as S10, S11, S14, or S15. As such, transistor P1, P3, N5, and N7, along with transistors P2, P4, N6, and N8, provide current flow paths between the power source terminal 10 and the power sink terminal 20.

Additional terminal interconnections may be used to provide additional meaningful terminal to terminal connectivity and functionality (for example, transistor bypass switches, such as by S3, S7, S11, S12, S15, S20, or S22). Also, one or more transistor bias switches, ones connected from the gate to the drain of a transistor, such as by S4, S13, S16, or S23, can be provided to provide addition connectivity.

Moreover, like terminals of different transistors may also be coupled to provide addition meaningful connectivity. For example, one or more of the gate terminals of transistors may be connected together, such as by S1, S9, S17, or S24, or one or more of source or drain terminals may be connected together, such as by S8 or S18. It also is possible to provide additional meaningful connections by providing terminal connections between transistor terminals not otherwise directly coupled, such as by S6. The amount and type of interconnections allow evolution to explore and utilize a variety of basic analog and/or digital circuits, of various granularities such as, for example, current mirror, differential current pair, amplifier, multi-input NAND gate, multi-input XOR gate, inverter, and more, which may be formed through appropriate switch activation, to arrive at a solution.

The types of interconnections represented in FIG. 2 by switches S1–S24, may be used in embodiments of the present invention to provide the responsive means. Not all of the switches are necessary. Additionally, other connections not shown may be used. For example, an additional switch may be connected from the drain of P3 to the drain of N8, or across the source and drain of P4. On the other hand, in embodiments where switch state is controlled by serially shifting to each switch to download each bit of the chromosome string, more switch couplings will take more time to program and not necessarily provide additional benefits. In yet other embodiments, some of the transistor bypass switches, such as S12, S15, and S22 may be omitted to facilitate cascading of additional modules.

Furthermore, although preferred, it is not necessary with the present invention, to provide a module having eight transistors. The number of transistors maybe greater or less than eight. The optimal number and arrangement is task dependent. Eight transistors of complimentary conduction types, such as N-type and P-type, is expected to provide a universal application for an evolvable analog circuit. Likewise, pairing the transistors P1–P2, P3–P4, N5–N6, and N7–N8 within the module, as shown in FIG. 2, is not necessary in all embodiments of the present invention. Pairing of the transistors, however, is expected to provide a universal application for an evolvable analog circuit.

Similarly, arranging the transistors in a particular number of layers within the module, such as for example the four layers formed by the transistor pairs P1–P2, P3–P4, N5–N6, and N7–N8, as shown in FIG. 2, is not necessary in all embodiments of the present invention. Some preferred embodiments may have six, eight, or more layers. Fewer layers also is possible (e.g. three or two or possibly a single layer). Providing about four layers of the transistors, however, is expected to provide a universal application for an evolvable analog circuit. The layered structure of the preferred embodiment is patterned after some common designs of analog and digital structures. Other embodiments, however, may have a structure tailored for a specific application.

In some embodiments, the terminal interconnections are provided to facilitate power flow from power source 10 to power sink 20, along with left to right lateral and/or laterally and downward connection. Such interconnection strategy, with a module output at, for example, P4 and/or N6, and/or others, allows for cascading signal flow to additional modules, which may be added if desired to provide further evolutionary solutions. Further, feedback type interconnections are also possible in some embodiments, within a module, or more preferably between modules.

In the embodiment of FIG. 2, only four layers of pairs of transistors, two PMOS and two NMOS, were chosen for simplicity. The PTA architecture allows the implementation of bigger circuits by cascading PTA modules. Embodiments of the present invention may have each chip implementing one PTA module, or many modules may be present on each chip. To offer sufficient flexibility the module of this embodiment has all transistors terminals, except those connected to power and ground, connected via switches to expansion terminals, not shown, to allow switchable coupling of input and output signals to modules and to allow interconnection between modules to facilitate evolution.

Various module interconnections are possible. For example, some embodiments may have modules coupled so that a module is connected to adjacent modules, such as in north, south, east, and west to form a neighborhood, and have additional connectivity with one or more modules from a different neighborhood, such as jumping over a set of modules, for example jumping one to four modules, to a different neighborhood. It is possible to have one to four interconnections locally while having less extending to modules in other neighborhoods.

In one embodiment expected to provide a universal application for evolvable analog circuits, it is preferred to have higher density of module to module interconnections in a center portion of a layout and a lower density of interconnections at the periphery. This is because, in some situations, too many module to module interconnections could complicate evolution and be detrimental to stabilization. In other situations, more interconnections may be necessary to provide a more complicated solution. As this may not be established before array layout and fabrication, a non-homogeneous layout is expected to provide more flexibility when for evolutionary purposes.

In one possible embodiment, because it is not always known beforehand how many modules are needed to evolve a solution, it may be possible to use many internal test points on the PTA as possible outputs for evaluation of the distance of the response from the target response. This may be implemented using individuals in the same population with different sizes (chromosome length), or simply parallel evaluation of the routed outputs of many circuits. A part of the genetic code could indicate where the output is to be probed.

In some embodiments, the programmable or reconfigurable switches S1–S24 are implemented with transistors, such as a pair of NMOS-PMOS back to back transistors acting as a simple T-gate switch. In these embodiments, the transistor T-gate switches are selected: to pass analog signals; to have the resistance of each switch variable between low (approximately tens or hundreds of ohms) and high (in excess of tens and hundreds of Mohms and above); and to preferably provide an intermediate resistance (although its linearity is not necessarily important in these embodiments). In practice, the switches are non-ideal in that they have a big, but finite, resistance in the OFF state (approximately Mohms or Gohms) and a non-zero resistance/impedance in the ON state (approximately tens of Ohms). This feature can facilitate evolution. While the effects of non-ideal switches may be negligible in a first approximation for many digital circuits, such effects may fundamentally affect analog programmable circuits.

Figure 3:
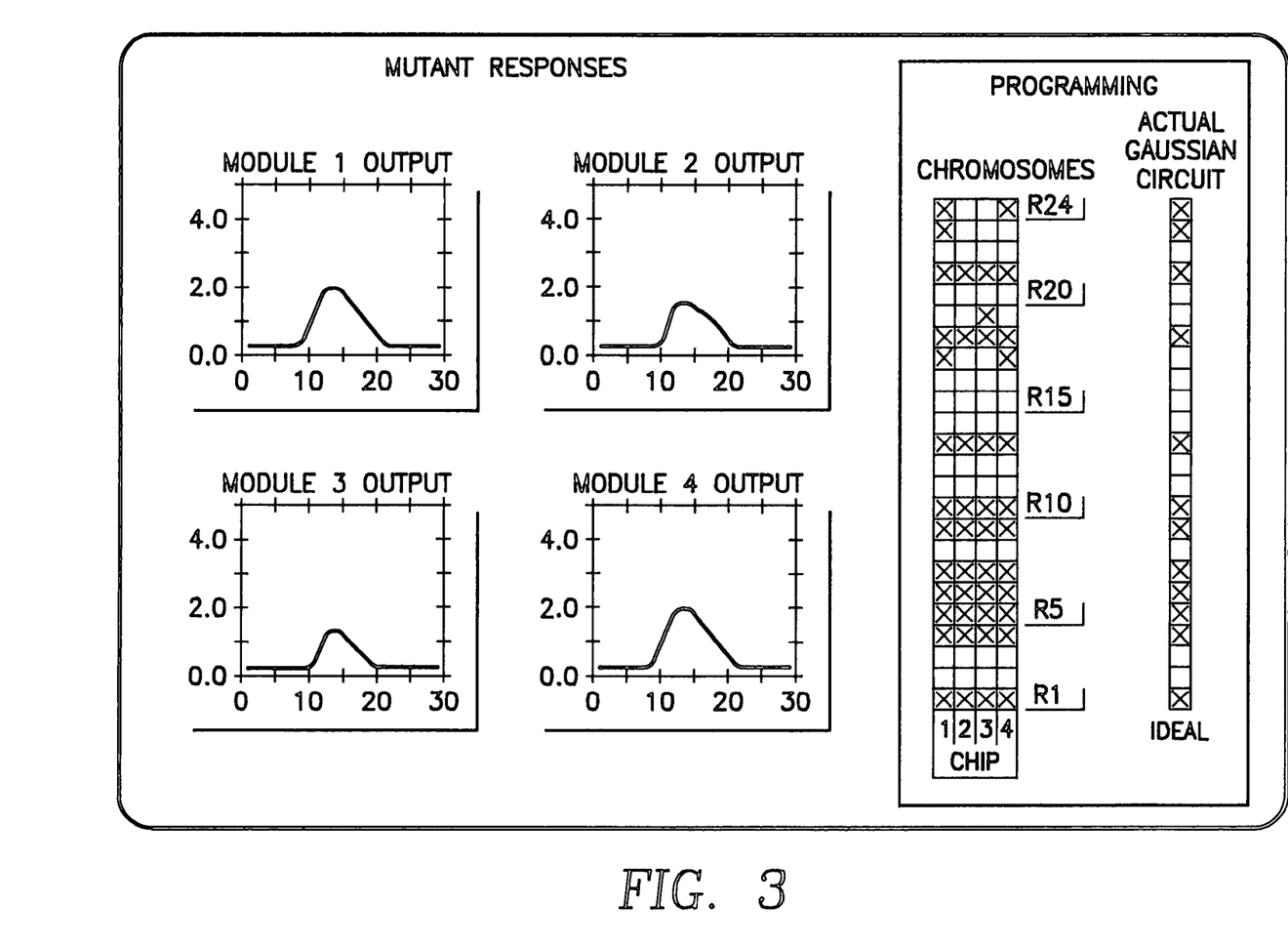
FIG. 3 illustrates several additional circuits obtained by evolution showing less than ideal but possibly useful circuit responses.

Turning to FIG. 3, besides leading to designs that are possible by human designers, evolution with non ideal components can lead to circuits that are unusual from the perspective of typical design practice. For example, synthesis of a DC circuit with a Gaussian response was performed in hardware in four separate chips. The four chips were programmed in parallel with bit-string configurations corresponding to four individuals of a population of 1000; then, the next four were programmed, and so on until all 1000 in one generation were tested. Evolution led to "Gaussian" circuit solutions within 20–30 generations.

In this example, the genetic algorithm parameters in one of the runs are as follows: Population: 1000; Chromosome size: 24 bits (1 PTA); 52–88 bits (2PTAs, variable depending on interconnection schemes); Evaluation samples: 30; Mutation rate: 4%; Cross Over rate: 70%; Tournament Selection: 20 individuals; Elit Strategy: 9% population size (88 individuals); Fitness Function: Square root Mean Error; Fitness [indiv.]=target(xi)$^2$−indiv(xi)$^2$}.

FIG. 3 shows four different hardware-evolved mutant solutions for a Gaussian curve provided by modules 1–4. The mutations in the genetic code of the solutions obtained by evolution, depicted vertically as chromosomes R24–R1 that correspond to switches S24–S1 of FIG. 2, may be compared with the human-designed solution of the Gaussian circuit located to the right of R24–R1. While those observed mutants had 2–4 switches away of the same solution humans would design, it is expected this property can be exploited by evolution to ultimately provide quite different solutions, possibly better, than a human designer in other applications. Even if this is not the case, such mutants may increase the number of valid solutions, thus easing the search for a solution. Moreover, it may provide alternate, or backup solutions, that may be used in the event that an evolved solution becomes invalid due to component faults or other irregularity.

Figure 4:
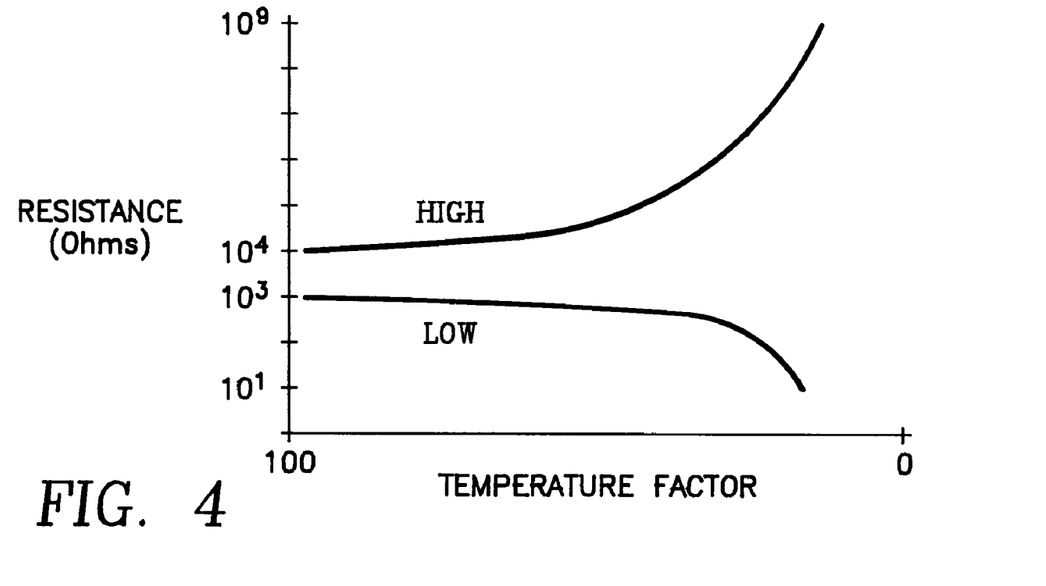
FIG. 4 represents the annealing type process used in some embodiments employing gradual switch states to provide evolution by morphing switch states.

Turning to FIG. 4, other embodiments of the present invention may employ gray or gradual switches as the reconfigurable switches S1–S24 of FIG. 2 to introduce an annealing effect to the evolutionary process. Instead of ON/OFF, the switches were considered as having a resistance Low/High (Low for ON state). The binary genetic code would thus specify if the switch is Low or High, but the numerical meaning of this qualitative code (e.g. a resistance related parameter) would change gradually as a function of a temperature-like parameter as illustrated in FIG. 4.

Initially the temperature is high, and Low and High switch status have values close to each other, such as 2 Mohms for Low and 20 Mohms for High. Gradually, the temperature goes down and the switch resistance polarizes to the extremes of for example 10's of Ohms for Low and 10's of Gohms for High. The number of generations was chosen to ensure some quasi-static behavior. This is because the response of the same best individuals from older generation differed in the newer generation because the circuit had different resistance for switches.

This evolution through a gradual morphing process proved more efficient in simulation than searches in which the switches High or Low of extreme values, such as 10's of Ohms for Low and 10's of Gohms for High, were fixed at all times. Thus, evolution using gradual switch values provided as much as an order of magnitude faster solution.

Many solutions observed while running through this "freezing" process were acceptable solutions with switches partly open, in effect with all transistors taking part in generating the function. It may be preferred in some embodiments to allow the annealing process to continue until the switch states are frozen or polarized to their full high and low impedance states. This provides more robust solutions, ones that are not as sensitive to thermal changes of transistors, or to other transistor dependent variations. In other embodiments, the switches may not be completely polarized. In such embodiments, the annealing process may be shortened, or not used at all, to provide solutions having switch states not completely polarized to their full high and low impedance states. Such solutions may be more desirable in certain instances, such as, for example, where design speed, resources, functionality, or other constraints make such solutions desirable.

Gradual switches allow variable control over the resistance of the switches so provide a means for variably controlling transistor coupling. The gradual switch may be implemented with transistors, such as a pair of NMOS-PMOS back to back transistors acting as a simple T-gate switch. The switches are selected as discussed above. In the implementation of one embodiment, the meaning of high or low is controlled by an A/D converter, either external or internal to the chip. In such an embodiment, a single bit of the bit string may be represented by several bits to provide adjustment of the value of high and low. Thus, a single bit used to qualitatively represent high or low is delivered to the A/D converter, which in turn provides a quantitative analog value of the high/low states to control the annealing process.

In one embodiment, to simplify device fabrication, the resistance value assigned the switches to represent high and low are controlled together to provide homogeneous control of high/low values of the switches. It also is possible in some embodiments to provide heterogeneous control of the switch annealing process to provide non-uniform, or even individual control of the values representing high and low.

Figure 5:
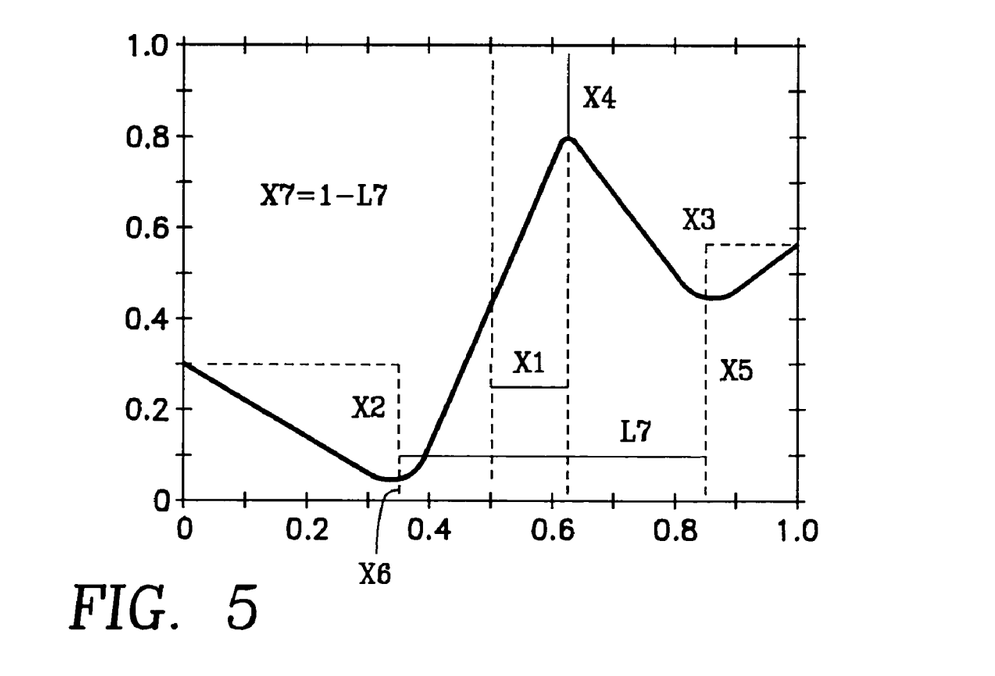
FIG. 5 shows parameter used for specification of a fitness function.

A fitness function which considers shape information by using a weighted combination of parameters x1–x7 as depicted in FIG. 5 also can improve evolution search efficiency over a Euclidian type fitness function in some applications. Fitness functions, such as the one of FIG. 5 used to evolve a Gaussian response circuit, however, generally do not have broad applicability.

While the preferred embodiments and methods of the present invention have been described in detail above, many changes to these embodiments and methods may be made without departing from the true scope and teachings of the present invention. The present invention, therefore, is limited only as claimed below and the equivalents thereof.

What is claimed is:

1. An evolvable circuit, comprising:
a plurality of transistors, each of said transistors comprising a first power terminal, a second power terminal and a control terminal;
a plurality of reconfigurable switches, each single one of said switches providing an individual interruptable terminal-to-terminal connection among said transistors, said plurality of reconfigurable switches comprising:
a first plurality of reconfigurable switches that when in a closed position form a first series-connected succession of said transistors, whereby each pair of successive transistors in said succession have a connection at the first power terminal of one transistor and the second power terminal of the other transistor of the pair through a corresponding single reconfigurable switch, each connection being governed by the corresponding single reconfigurable switch.

2. The circuit of claim 1 wherein the number of said transistors exceeds three and the number of said reconfigurable switches is within an order of magnitude of the number of terminals of said plurality of transistors, said number of terminals including said first power terminals, said second power terminals and said control terminals of said plurality of transistors.

3. The circuit of claim 2, wherein said plurality of reconfigurable switches comprises reconfigurable switches having variable conductance states.

4. The evolvable circuit of claim 1 wherein said plurality of reconfigurable switches further comprises:
a second plurality of reconfigurable switches connected between the first power terminals of respective pairs of said transistors.

5. The evolvable circuit of claim 4 wherein said plurality of reconfigurable switches further comprises:

A third plurality of reconfigurable switches, each respective one of which is connected between the control terminal and said first power terminal of a respective one of said transistors.

6. The circuit of claim 5 wherein said first plurality of reconfigurable switches forms plural respective series-connected successions of transistors that are parallel to one another, and wherein said plurality of reconfigurable switches further comprises:

a fourth plurality of reconfigurable switches each connected between the control terminals of a pair of corresponding ones of the transistors in different ones of said series-connected successions of transistors.

7. The circuit of claim 6 wherein said plural series-connected successions of transistors are arranged in columns of transistors, the corresponding transistors in different columns forming rows of transistors, the transistors in a first plurality of said rows being of a first conductivity type and the transistors in the remaining ones of said rows being of a second conductivity type complementary to said first conductivity type.

8. The circuit of claim 6 wherein said plurality of reconfigurable switches further comprises:

A fifth plurality of reconfigurable switches connected between one of said first and second power terminals of the transistors of different ones of said series-connected successions of transistors.

9. The circuit of claim 8 wherein said plurality of reconfigurable switches further comprises:

a reconfigurable switch connected between the first power terminal of a transistor in one of said series-connected successions of transistors and the second power terminal of a transistor of a different one of said series-connected successions of transistors.

10. An evolvable circuit comprising:

a plurality of transistors, each of said transistors comprising a first power terminal, a second power terminal and a control terminal;

a plurality of reconfigurable switches, each single one of said reconfigurable switches providing an individual interrruptable terminal-to-terminal connection in said plurality of transistors; and all terminal-to-terminal connections among said plurality of transistors being provided through respective ones of said plurality of reconfigurable switches with the exception of connections through voltage sources.

11. The circuit of claim 10 wherein the plurality of transistors comprises at least one transistor cell comprising eight transistors in a two column by four row configuration.

12. The circuit of claim 11, comprising a plurality of cells connected by at least one pair of transistors.

13. An evolvable circuit comprising:

a plurality of transistors, each of said transistors comprising a first power terminal, a second power terminal and a control terminal;

a plurality of reconfigurable switches, each single one of said reconfigurable switches providing an individual interruptable terminal-to-terminal connection in said plurality of transistors; and wherein the number of said reconfigurable switches exceeds three and the number of said reconfigurable switches is within an order of magnitude of the number of terminals of said plurality of transistors, said number of terminals including said first power terminals, said second power terminals and said control terminals of said plurality of transistors.

14. The circuit of claim 13, wherein the number of said reconfigurable switches is at least the same as the number of terminals of said plurality of said transistors.

15. The circuit of claim 13 wherein said plurality of reconfigurable switches comprise reconfigurable switches having variable conductances.

16. A circuit functioning successively in two modes including a configuration mode in which the topology of said circuit is modifiable and an operation mode in which the topology of said circuit is fixed, said circuit comprising:

a plurality of transistors, each of said transistors comprising a first power terminal, a second power terminal and a control terminal, the states of said transistors changing during said operation mode;

a plurality of reconfigurable switches whose states are modifiable in accordance with an evolutionary algorithm in said configuration mode and fixed in said operating mode, each single one of said reconfigurable switches providing an individual interruptable terminal-to-terminal connection between a respective pair of said transistors whereby one transistor is isolatable from another adjacent transistor, and defining an instantaneous topology of said circuit.

17. The circuit of claim 16, wherein the number of said transistors exceeds three and the number of said reconfigurable switches is within an order of magnitude of the number of terminals of said plurality of transistors, said number of terminals including said first power terminals, said second power terminals and said control terminals of said plurality of transistors.

18. The circuit of claim 17, wherein the number of said reconfigurable switches is the same as the number of said plurality of transistors.

19. The circuit of claim 16 wherein said plurality of reconfigurable switches comprises:

a first plurality of reconfigurable switches connected to form a first series-connected succession of said transistors, whereby each pair of successive transistors in said succession have a connection at the first power terminal of one transistor and the second power terminal of the other transistor of the pair through a corresponding single reconfigurable switch, each connection being governed by the corresponding single reconfigurable switch.

20. The circuit of claim 16 wherein said plurality of reconfigurable switches comprises reconfigurable switches having variable conductances.

* * * * *